United States Patent
Beale et al.

(10) Patent No.: US 7,230,506 B2
(45) Date of Patent: Jun. 12, 2007

(54) CROSSTALK REDUCTION FOR A SYSTEM OF DIFFERENTIAL LINE PAIRS

(75) Inventors: William Beale, Beaverton, OR (US); John T. Stonick, Portland, OR (US); Jeffrey L. Sonntag, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 10/682,617

(22) Filed: Oct. 9, 2003

(65) Prior Publication Data

US 2005/0077977 A1    Apr. 14, 2005

(51) Int. Cl.
*H01P 3/04* (2006.01)

(52) U.S. Cl. .............................. 333/5; 333/1

(58) Field of Classification Search ............ 333/1, 333/4, 5, 236, 238
See application file for complete search history.

(56) References Cited

U.S. PATENT DOCUMENTS

| | | | | |
|---|---|---|---|---|
| 4,891,616 A | * | 1/1990 | Renken et al. | 333/236 |
| 5,488,201 A | * | 1/1996 | Liu | 174/262 |
| 5,618,185 A | * | 4/1997 | Aekins | 439/76.1 |
| 5,908,333 A | | 6/1999 | Perino et al. | 439/631 |
| 6,266,730 B1 | | 7/2001 | Perino et al. | 710/126 |
| 6,420,778 B1 | | 7/2002 | Sinyansky | 257/664 |
| 6,449,308 B1 | | 9/2002 | Knight, Jr. et al. | 375/212 |
| 6,530,062 B1 | | 3/2003 | Liaw et al. | 716/2 |
| 6,553,446 B1 | | 4/2003 | Miller | 710/307 |
| 6,570,944 B2 | | 5/2003 | Best et al. | 375/355 |
| 6,590,781 B2 | | 7/2003 | Kollipara et al. | 361/760 |
| 6,618,834 B2 | | 9/2003 | Takeyama et al. | 716/2 |
| 2003/0123236 A1 | | 7/2003 | McGrath et al. | 439/760 |
| 2003/0147375 A1 | | 8/2003 | Goergen et al. | 370/351 |
| 2003/0161086 A1 | | 8/2003 | Anthony | 361/112 |
| 2003/0171010 A1 | | 9/2003 | Winings et al. | 439/55 |

* cited by examiner

*Primary Examiner*—Benny Lee
(74) *Attorney, Agent, or Firm*—Park, Vaughan & Fleming, LLP

(57) ABSTRACT

A technique is presented for minimizing crosstalk between adjacent differential signal pairs in communications. A backplane embodiment wherein the backplane includes a plurality of differential signal line pairs, is presented. A first differential signal line pair can include a first differential signal line and a second differential signal line. The backplane can have the first differential signal line connected between first and second vias. The second differential signal line can be connected between third and fourth vias. A third signal line can be connected between fifth and sixth vias. The first via can be spatially adjacent to the fifth via such that a signal on the third signal line is coupled to the first differential signal line and the fourth via can be spatially located adjacent to the sixth via such that a signal on the third signal line is coupled to the second differential signal line.

15 Claims, 15 Drawing Sheets

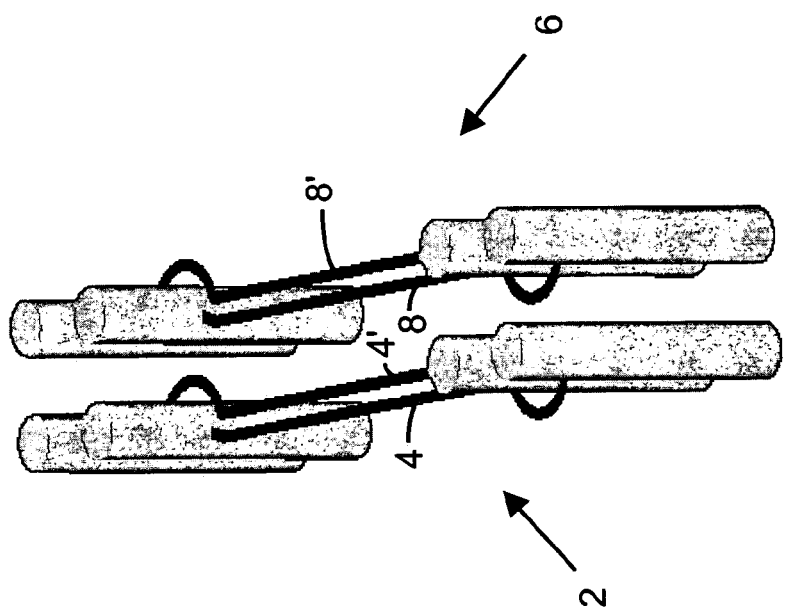

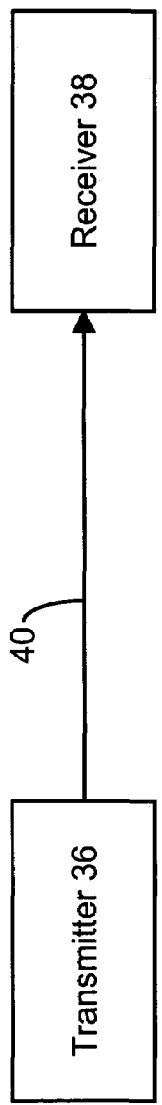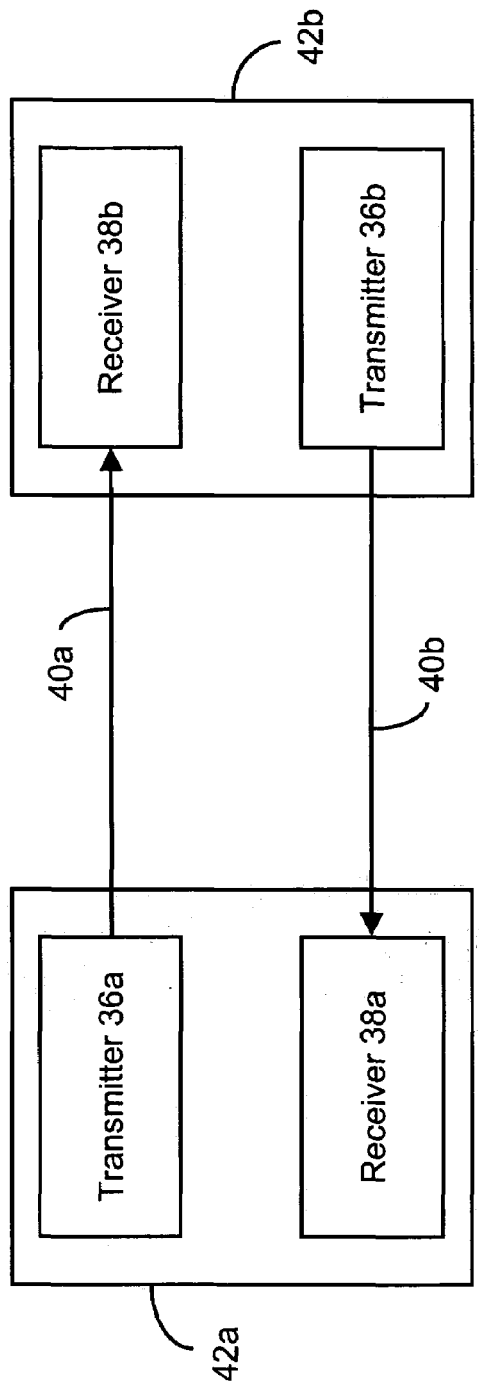
FIGURE 6A
FIGURE 6B

CROSSTALK REDUCTION FOR A SYSTEM OF DIFFERENTIAL LINE PAIRS

BACKGROUND OF THE INVENTION

This invention relates to systems and techniques that are used to enhance the performance of data communication systems employing differential signaling techniques; and more particularly, in one aspect, to enhance the performance of data communication systems, using differential signaling, implemented in wired type environments such as microstrip, stripline, printed circuit board (for example, a backplane), and integrated circuit (IC) package.

Communications systems are continuing to increase the rate at which data is transmitted between devices. The increase in data rate presents a challenge to maintain, enhance or optimize the ability to recover the transmitted signal and thereby the information contained therein. In general, increasing the rate of transfer of data tends to adversely impact the fidelity of the communications.

In the context of communications systems employing differential signaling, the layout of the signal path in, for example, a backplane or printed circuit board environment, may impact the ability of the receiver to recover the transmitted information. Conventional systems tend to layout the signal paths of differential signal pairs in a manner that minimizes or eliminates skew (relative time delay) between the differential signal pair. As such, conventional systems tend to layout signal paths so that differential signal pairs are transmitted on paths having the shortest and equal lengths. In this way, the contribution to skew (of a differential signal pair) as a result of the signal path layout in a backplane or printed circuit board environment is minimized or substantially eliminated.

For example, with reference to FIGS. 1 and 2A, 2B, 2C, a conventional data communications system typically includes a layout or routing of differential signal pair 2 such that signal paths 4 and 4' are equal (and the shortest) lengths. Similarly, differential signal pair 6 may be transmitted on signal paths 8 and 8', which are also equal in length. As such, the layout of the signal paths is unlikely to introduce additional skew between the respective signal pairs 2 and 6. (See, for example, U.S. Pat. Nos. 6,249,544 and 6,252,904). This is significant because the receiver employs the difference between the signals of the differential signal pairs, sampled at a particular time, in order to recover the transmitted information.

While conventional systems avoid certain debilitating affects on the fidelity of the differential signal as a result of skew between the differential signal pair, such systems tend to experience significant coupling or crosstalk from adjacent signals (for example, inductive and/or capacitive coupling) which adversely impacts the ability of the receiver to recover the transmitted information. For example, with continued reference to FIG. 1, the signal transmitted on signal path 4 is likely to experience cross coupling, at the vias or connector pins, between the signal on signal path 8. Similarly, the signal transmitted on signal path 4' is likely to experience cross coupling, at the vias or pins, between the signal on signal path 8'.

Conventional systems often address such crosstalk using circuitry, additional insulation materials to "shield" the signals, and/or intricate layout techniques. (See, for example, U.S. Pat. Nos. 6,266,730, 6,420,778, 6,449,308, and 6,570,944 and U.S. Patent Application Publication 2003/014375). Such conventional crosstalk reduction techniques may be quite complicated to implement as well as expensive. In this regard, systems that employ crosstalk reduction circuitry tend to consume power and space/area, for example, on the die or printed circuit board. Further, conventional systems that employ additional materials to "shield" the signals and/or complicated layout techniques are often expensive, and/or the layout techniques may be quite complicated and susceptible to manufacturing tolerances, which are often quite strict.

There is a need for a system and technique that overcomes the shortcomings of one, some or all of conventional systems. In this regard, there is a need for an improved crosstalk reduction or management technique that is less complicated and expensive than conventional circuitry and techniques and that overcomes one, some or all of the shortcomings of conventional systems.

SUMMARY OF THE INVENTION

There are many inventions described and illustrated herein. In a first principal aspect, the present invention is a backplane for a communications system, wherein the backplane includes a plurality of differential signal line pairs, including a first differential signal line pair having a first differential signal line and a second differential signal line. Each differential signal line pair provides a communications path for a differential signal pair including a first signal and a second signal wherein the first and second signals are differential signals.

The backplane, in this aspect of the present invention, includes a plurality of vias, including first, second, third, fourth, fifth and sixth vias. A first differential signal line is connected between the first and second vias to provide a communications path for the first signal of a first differential signal pair. A second differential signal line is connected between the third and fourth vias to provide a communications path for the second signal of the first differential signal pair. Further, a third signal line is connected between fifth and sixth via to provide a communications path for a third signal.

The first via is spatially located or position adjacent to the fifth via such that a signal on the third signal line is coupled to the first signal and wherein the fourth via is spatially located adjacent to the sixth via such that the signal on the third signal line is coupled to the second signal. The coupling between the first signal and the third signal is substantially equal to the coupling between the second signal and third signal.

In one embodiment of this aspect of the present invention, the backplane includes a plurality of conductor planes wherein the third signal line is on a first conductor plane and the first and second differential signal lines are on a second conductor plane. In another embodiment, the third signal line is on the same conductor plane as the first and second differential signal lines.

The backplane of this aspect of the present invention may include a skew adjustment path, located in the second differential signal line between the third and fourth vias. In this embodiment, the first and second differential signal lines of the first differential signal pair may be substantially equal.

In another aspect, the present invention is a backplane for a communications system including a first and second differential signal line pairs, wherein each differential signal line pair includes a first differential signal line and a second differential signal line. Each differential signal line pair provides a communications path for a corresponding differential signal pair including a first signal and a second signal wherein the first and second signals are differential signals.

The backplane of this aspect of the invention includes a first differential signal line of the first differential signal pair, wherein the first differential signal line is coupled between the first and second vias. The backplane also includes a second differential signal line of the first differential signal pair, wherein the second differential signal line is coupled between the third and fourth vias.

Further, the backplane includes a first differential signal line of the second differential signal pair which is coupled between the fifth and sixth vias and a second differential signal line of the second differential signal pair which is coupled between the seventh and eight vias.

In this aspect of the present invention, the first via is spatially located adjacent to the fifth via such that the signal on the first differential signal line of the second differential signal pair is coupled to the signal on the first differential signal line of the first differential signal pair. The second via is spatially located adjacent to the eighth via such that the signal on the second differential signal line of the second differential signal pair is coupled to the signal on the first differential signal line of the first differential signal pair. The third via is spatially located adjacent to the seventh via such that the signal on the second differential signal line of the second differential signal pair is coupled to the signal on the second differential signal line of the first differential signal pair. The fourth via is spatially located adjacent to the sixth via such that the signal on the first differential signal line of the second differential signal pair is coupled to the signal on the second differential signal line of the first differential signal pair.

Notably, the crosstalk between the signal on the first differential signal line of the first differential signal pair and the signals on the first and second differential signal lines of the second differential pair is substantially equal to the crosstalk between the signal on the second differential signal line of the first differential signal pair and the signals on the first and second differential signal lines of the second differential pair.

In one embodiment of this aspect of the invention, the backplane includes a plurality of conductor planes wherein the first and second differential signal lines are located on different conductor planes. In another embodiment, the first and second differential signal lines are located on the same conductor planes.

In one embodiment the second differential signal line of the first differential signal pair includes a skew adjustment path located between its first end and its second end. In this embodiment, the lengths of the first and second differential signal lines of the first differential signal pair are substantially equal. In another embodiment, the first and second differential signal lines of the second differential signal pair include a layout having a topology that corresponds to the topology of the skew adjustment path. In this embodiment, the lengths of each differential signal lines of the first and second differential signal pairs are substantially equal.

Again, there are many inventions described and illustrated herein. This Summary is not exhaustive and/or indicative of the entire scope of the present invention. This Summary is not intended to be limiting of the invention and should not be interpreted in that manner. While certain embodiments, features, attributes and advantages of the inventions have been described here, it should be understood that many others, as well as different and/or similar embodiments, features, attributes and/or advantages of the present inventions, which are apparent from the description, illustrations and claims herein.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly but may not be described in detail in the different figures. It is understood that various combinations of the structures, components, materials and/or elements, other than those specifically shown, are contemplated and are within the scope of the present invention.

FIGS. 2B and 2C are three-dimensional views of the conventional layout of differential signal pairs of FIG. 2A;

FIG. 6A is a block diagram representation of an exemplary communications system, including a transmitter and a receiver, in which the crosstalk reduction techniques and layout of present invention may be implemented;

FIG. 6B is a block diagram representation of transmitter/receiver pairs of an exemplary communications system, in which the crosstalk reduction techniques and layout of present invention may be implemented;

DETAILED DESCRIPTION OF THE INVENTION

Figure 1:
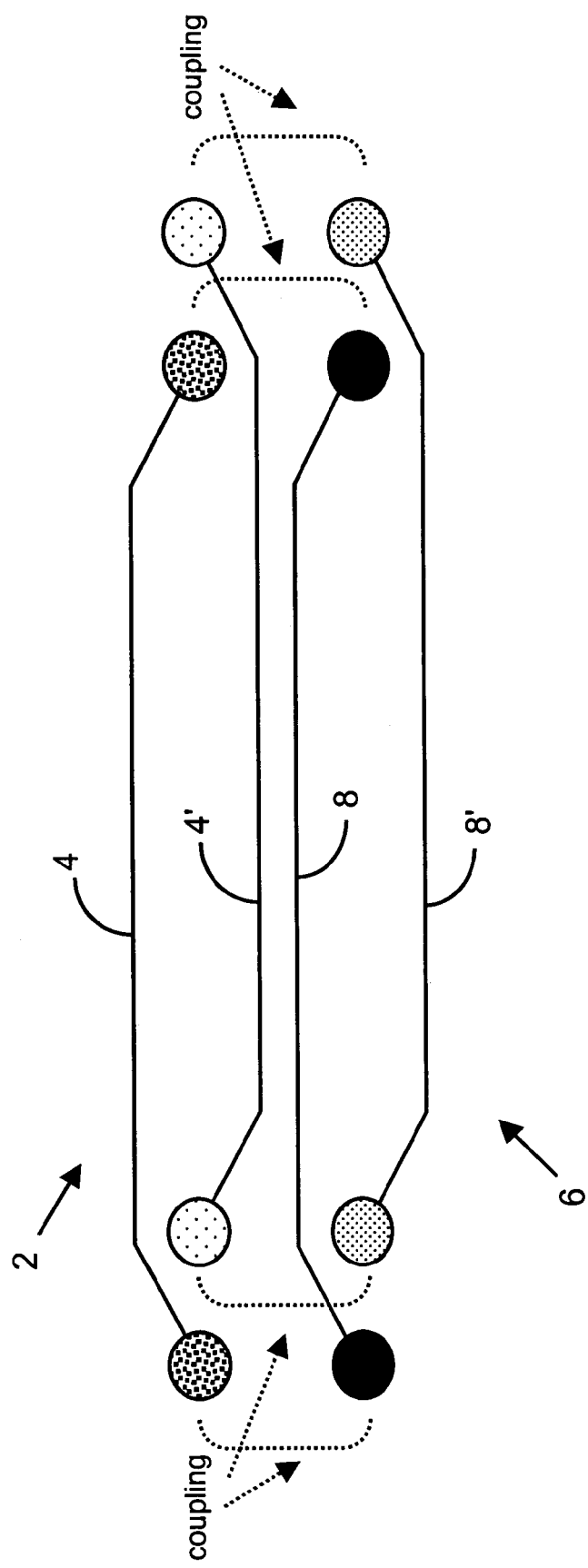
FIG. 1 is a block diagram representation of a conventional layout of differential signal pairs on, for example, a printed circuit board or backplane.
Figure 2A:
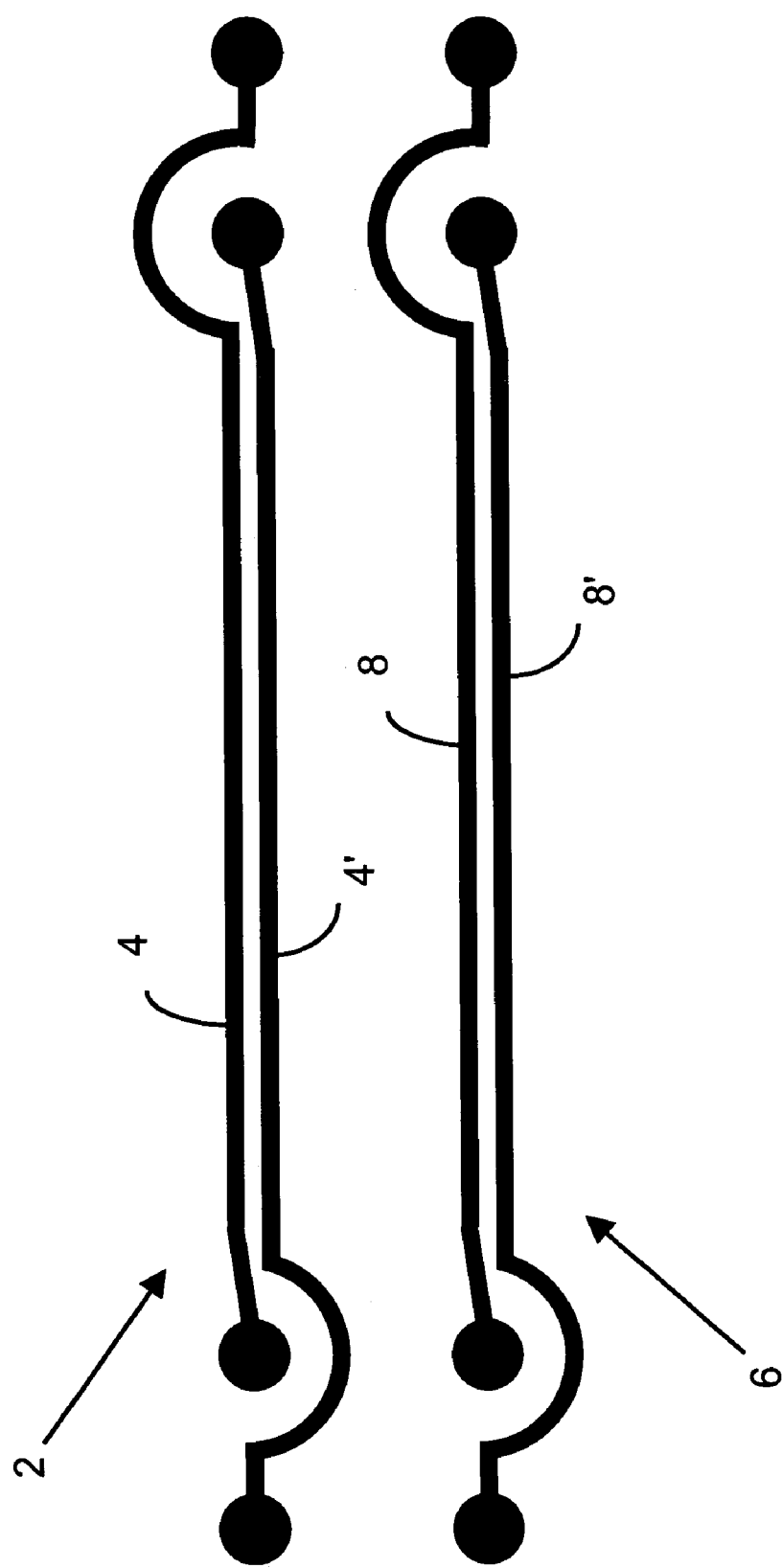
FIG. 2A is a plan view of a conventional layout of differential signal pairs on, for example, a printed circuit board or backplane.
Figure 2B:
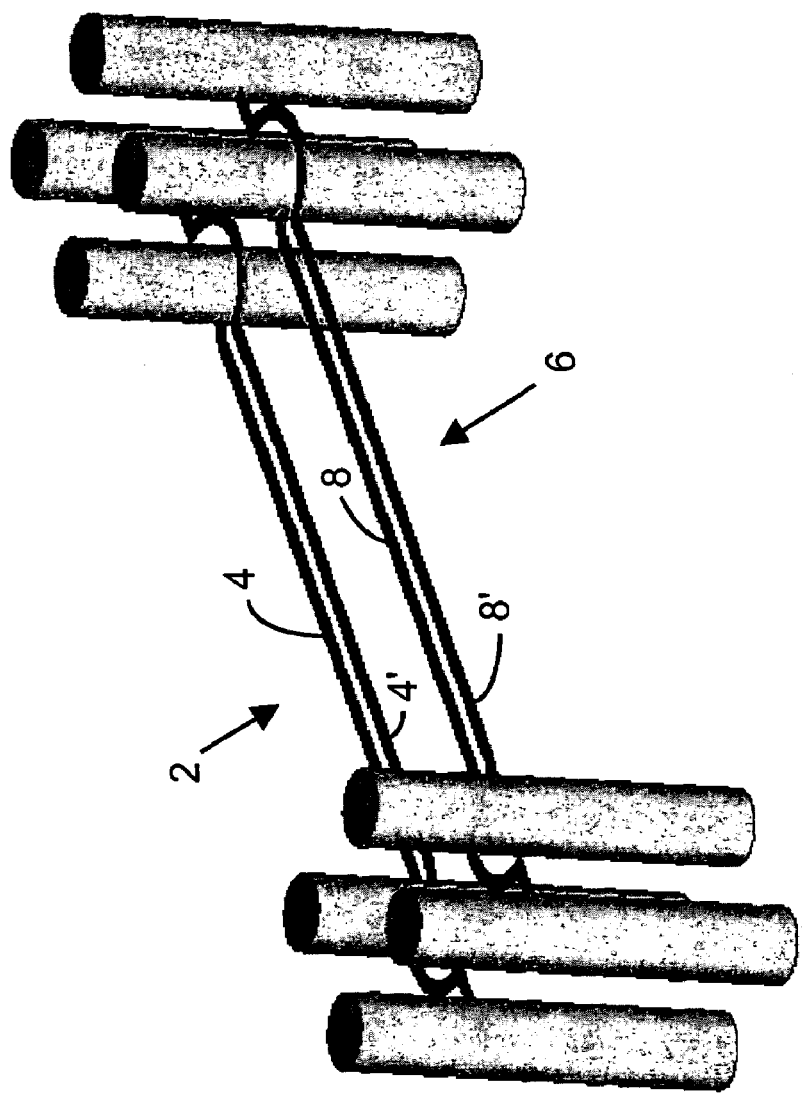
Figure 3:
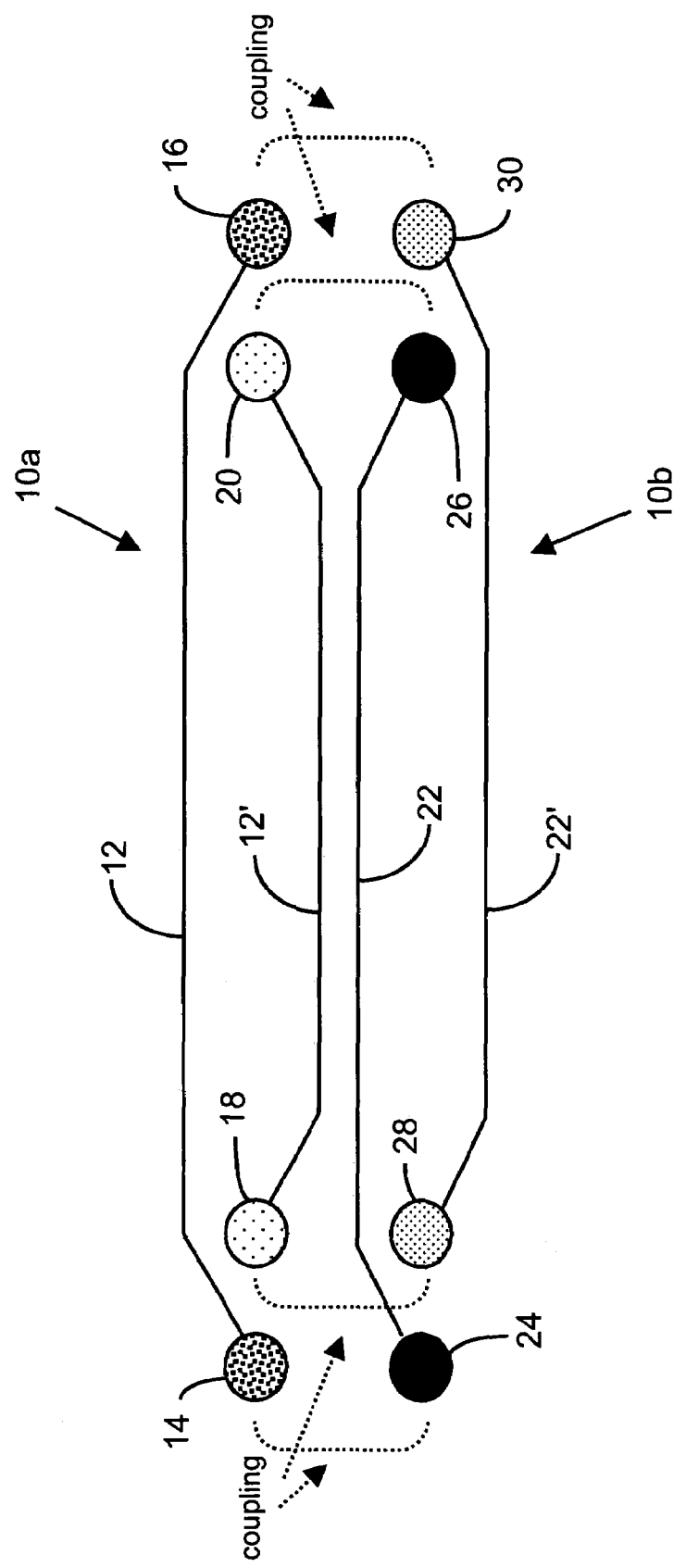
FIG. 3 is a block diagram representation of layout of differential signal pairs on, for example, a printed circuit board or backplane, according to one embodiment of the present invention.
Figure 4A:
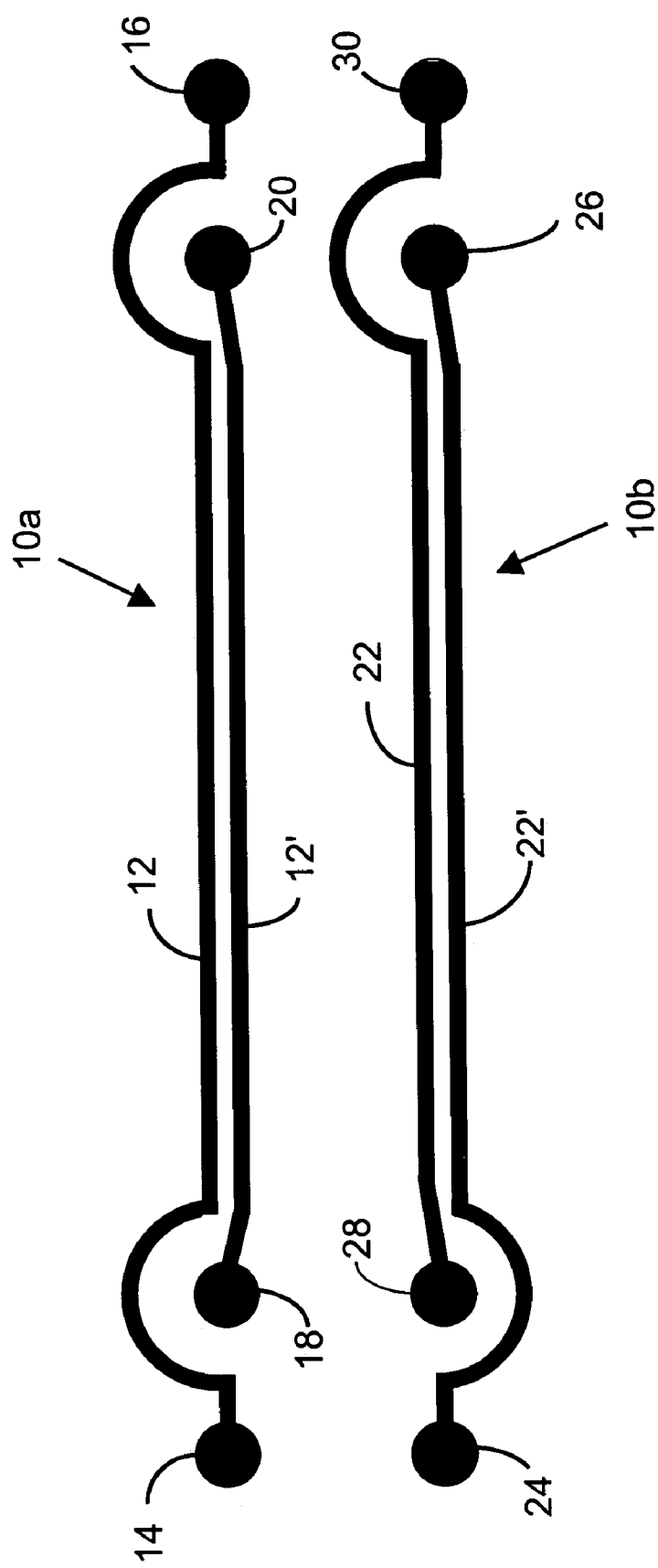
FIG. 4A is a plan view of a layout of differential signal pairs on, for example, a printed circuit board or backplane, according to one embodiment of the present invention.
Figure 4B:
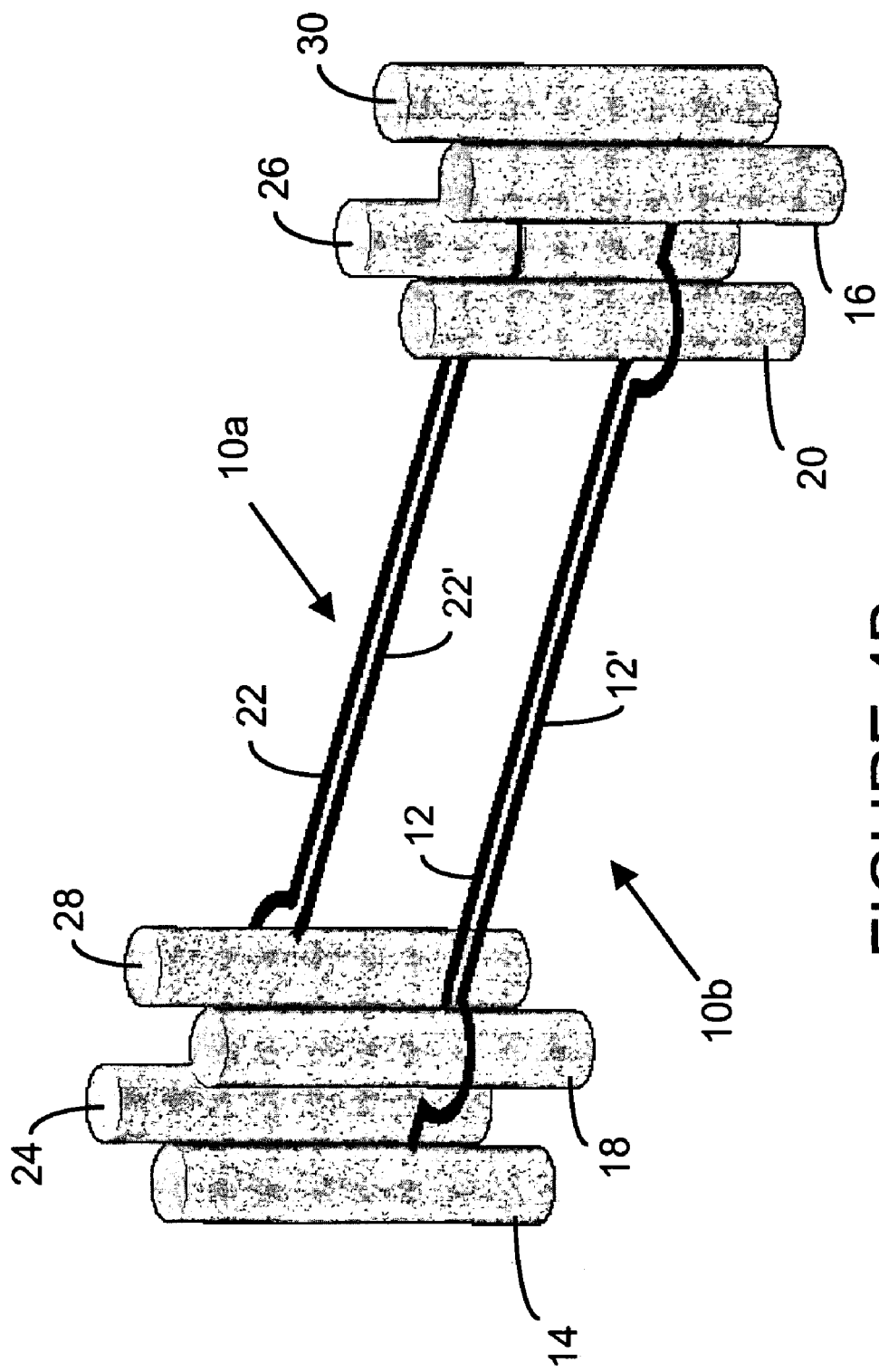
FIGS. 4B, 4C, 4D, 4E are three-dimensional views of the layout of differential signal pairs of FIG. 4A, according to one embodiment of the present invention.
Figure 4C:
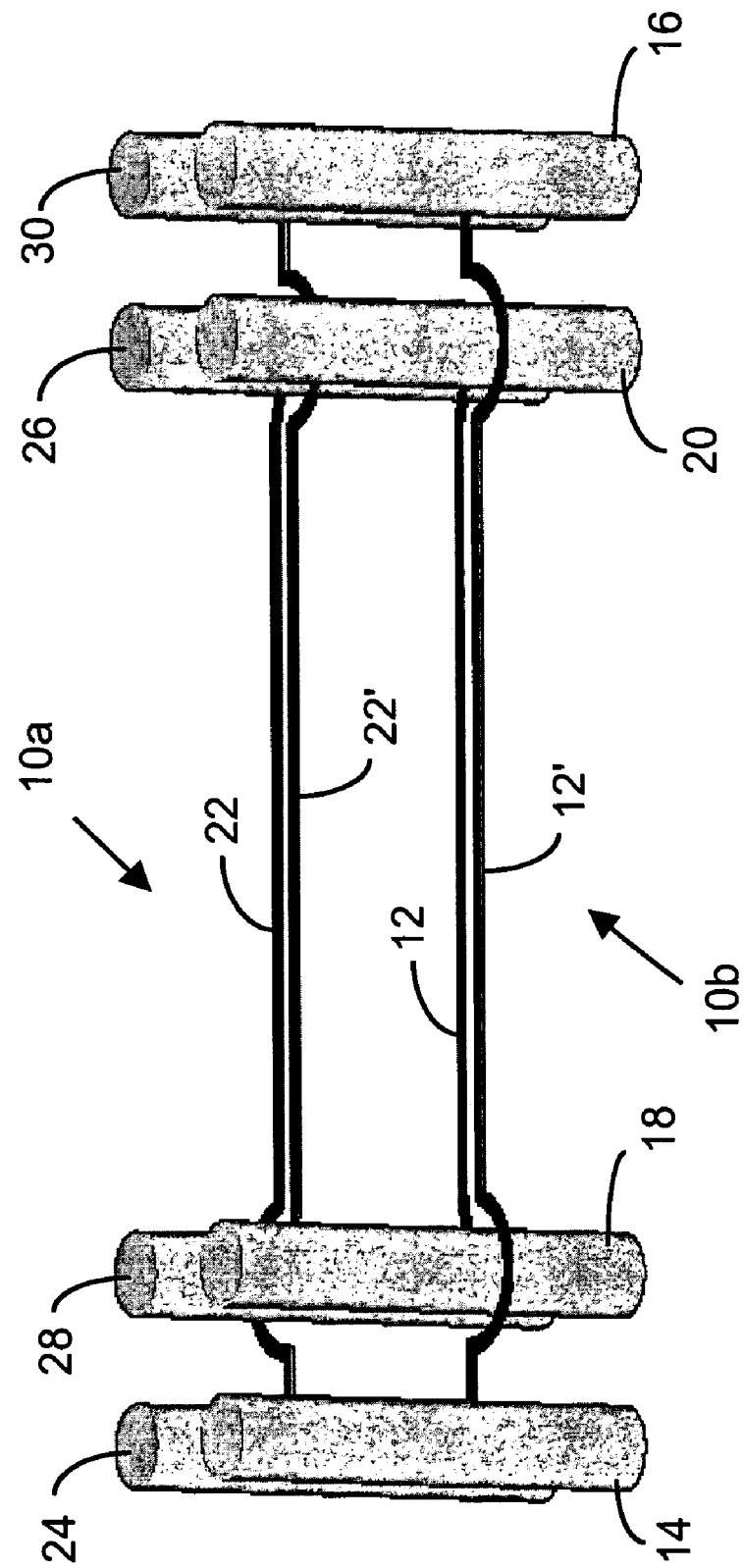
Figure 4D:
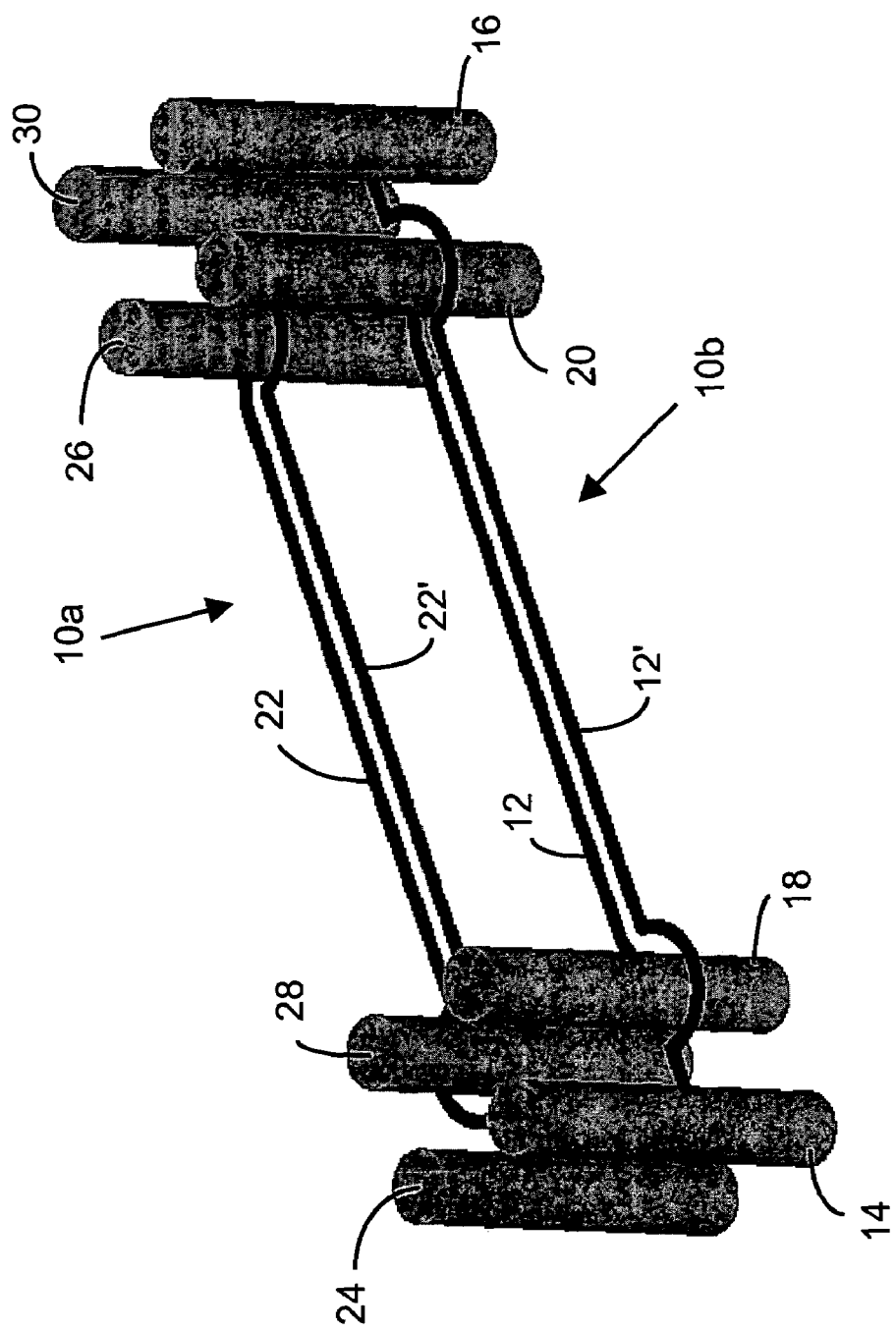
Figure 4E:
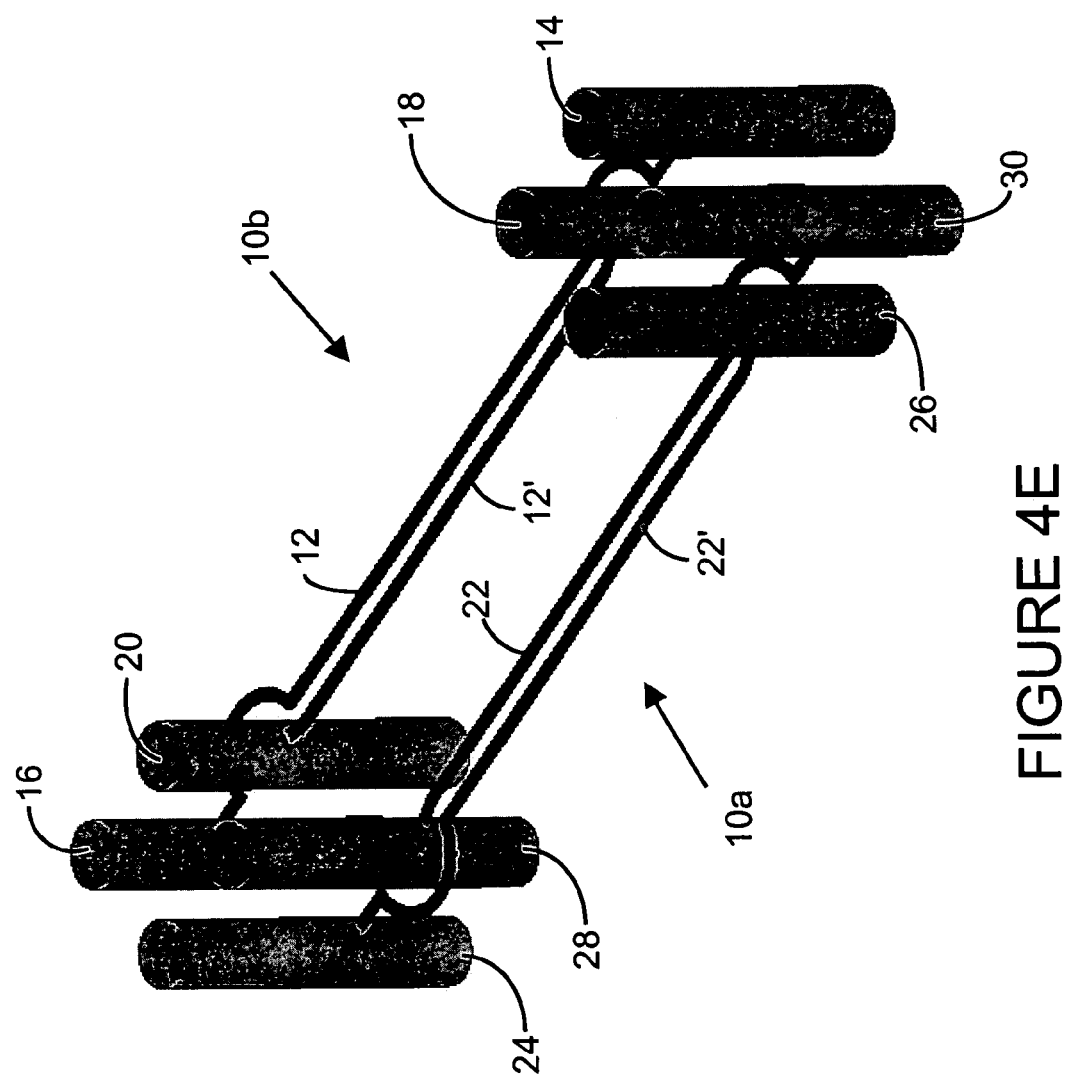

There are many inventions described and illustrated herein. In one aspect, the present invention is directed to a technique of and layout for reducing, minimizing and/or eliminating crosstalk between adjacent differential signal pairs in communications systems employing differential signaling.

With reference to FIGS. 3 and 4B, 4C, 4D, 4E, in one embodiment, differential signal pairs 10a and 10b are routed, for example, across a backplane, according to the present invention in order to reduce, minimize and/or eliminate crosstalk from adjacent differential signal pairs. In particular, in one embodiment of the present invention, a first differential signal of signal pair 10a is routed on signal line 12, which connects via 14 and via 16. Similarly, a second differential signal of signal pair 10a is routed on signal line 12', which connects via 18 and via 20. The differential signal pair 10b, which is spatially adjacent to differential signal pair 10a, includes a first differential signal routed on signal line 22 (between via 24 and via 26) and a second differential signal routed on signal line 22' (between via 28 and via 30).

In operation (with reference to FIGS. 3 and 4A, 4B, 4C, 4D, 4E), the signal on signal line 12 electrically couples to the signal on line 22 as a result of the close proximity of vias 14 and 24. The signal on signal line 12 also electrically couples to the signal on line 22' as a result of the close proximity of vias 16 and 30. Similarly, the signal on signal line 12' electrically couples to the signal on line 22' due to the close proximity of vias 18 and 28. The signal on signal line 12' also electrically couples to the signal on line 22 due to the proximity of vias 20 and 26.

Notably, the signals of differential signal pair 10b also couple to the signals of differential signal pair 10a in the same manner described above. That is, the signal on signal line 22' electrically couples to the signal on signal line 12' as a result of the close proximity of vias 28 and 18. The signal on signal line 22' also electrically couples to the signal on line 12 due to the close proximity of vias 30 and 16. Further, the signal on signal line 22 electrically couples to the signal on line 12 due to the proximity of vias 24 and 14. Similarly, the signal on line 22 electrically couples to the signal on signal line 12', because of the spatial relationship between vias 20 and 26.

The amount or impact of coupling between signal lines 12/12' and signal lines 22/22' is equal or substantially equal given the layout of the signal lines and the spatial relationship of the vias. As such, in operation, the amount or impact of crosstalk between signal lines 12 and 22 (at vias 14 and 24) is equal or substantially equal to the crosstalk between signal lines 12' and 22 (at vias 20 and 26). Similarly, the amount or impact of crosstalk between signal lines 12 and 22' (at vias 16 and 30) is equal or substantially equal to the crosstalk between signal lines 12' and 22' (at vias 18 and 28). As coupling is reciprocal, the equal or substantially equal coupling exists between signal lines 22/22' to signal lines 12/12' such that any difference in coupling between signal lines 22/22' to 12/12' is negligible (or not detrimental) to the operation of the communications system.

Figure 5:
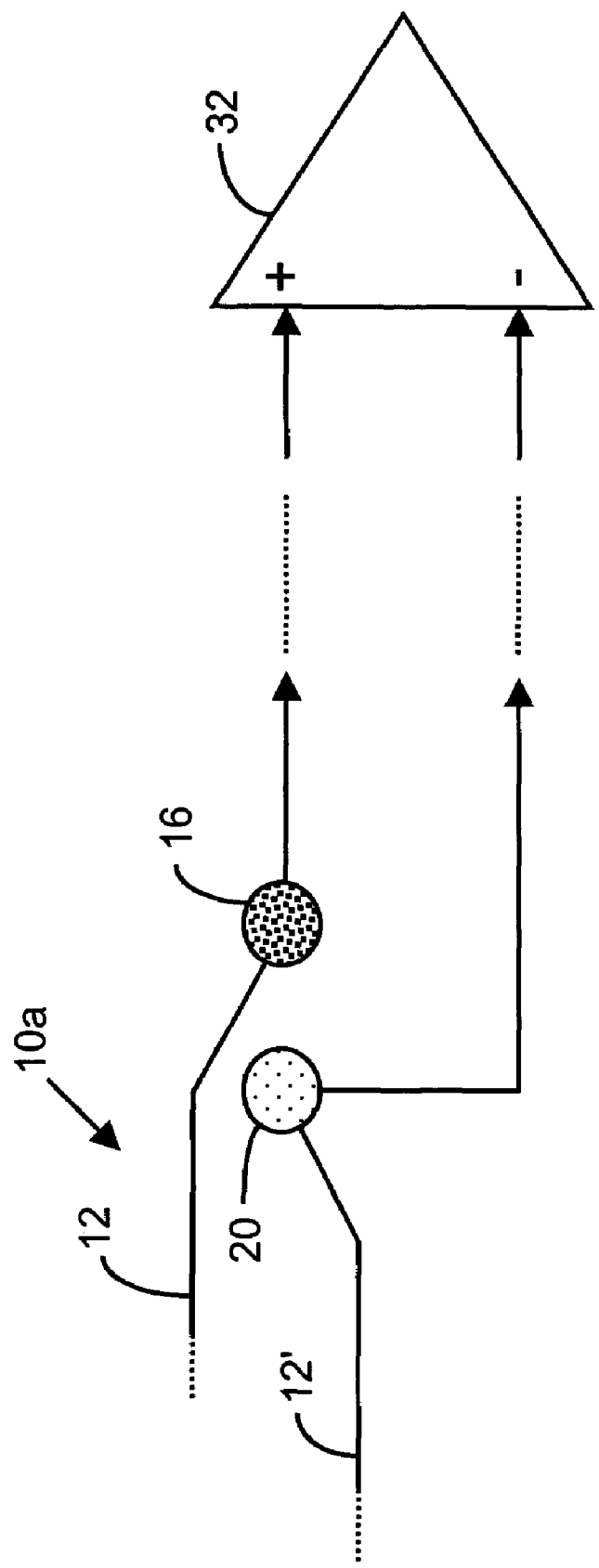
FIG. 5 is a block diagram representation of a differential signal pair of the layout of FIG. 3 coupled to a differential comparator-amplifier in accordance with one embodiment of the present invention.

With reference to FIG. 5, in one embodiment, differential comparator-amplifier 32 senses, samples and/or measures the difference between differential signal pair 10a (i.e., the voltage and/or current difference between the signals on lines 12 and 12'). Because each signal of the differential signal pair 10a includes the same coupled signal or crosstalk, differential comparator-amplifier 32 theoretically does not sense, sample and/or measure the signals coupled from adjacent differential signal pair 10b (i.e., the crosstalk from adjacent signals). In one embodiment, differential comparator-amplifier may be comprised of one or more cascaded high performance sense amplifiers.

The impact of the present invention may also be described mathematically. For example, a receiver that senses, samples and/or measures the difference between differential signal pair 10a may be expressed as:

$$Rx = Rx_{12} - Rx_{12'} \quad \text{(Equation 1)}$$

The crosstalk components on differential signal pair 10a may be expressed as:

$$Rx_{12x} = RX_{12\ (coupling\ from\ via\ 24)} + RX_{12\ (coupling\ from\ via\ 30)} \quad \text{(Equation 2)}$$

$$Rx_{12'x} = RX_{12'\ (coupling\ from\ via\ 28)} + RX_{12'\ (coupling\ from\ via\ 26)} \quad \text{(Equation 3)}$$

where:

$X_{12\ (coupling\ from\ via\ 24)}$ = crosstalk from signal line 22;
$X_{12\ (coupling\ from\ via\ 30)}$ = crosstalk from signal line 22';
$X_{12'\ (coupling\ from\ via\ 28)}$ = crosstalk from signal line 22; and
$X_{12'\ (coupling\ from\ via\ 26)}$ = crosstalk from signal line 22'.

Using Equations 1–3, the theoretical crosstalk of the layout according to the present invention may be expressed as:

$$Rx = X_{12\ (coupling\ from\ via\ 24)} + X_{12\ (coupling\ from\ via\ 30)} - X_{12'\ (coupling\ from\ via\ 28)} - X_{12'\ (coupling\ from\ via\ 26)} \quad \text{(Equation 4)}$$

Based on Equation 4, the amount of differential crosstalk may be expressed as:

$$Rx = \text{(crosstalk from line 22)} + \text{(crosstalk from line 22')} - \text{(crosstalk from line 22)} - \text{(crosstalk from line 22')}$$

Thus, the theoretical amount of differential crosstalk is zero.

Notably, as mentioned above, the amount or impact of coupling between signal lines 12/12' and signal lines 22/22' (at vias 14–20 and 24–30) is equal or substantially equal. That is, for example, the amount or impact of crosstalk between signal lines 12 and 22 (at vias 14 and 24) is equal or substantially equal to the crosstalk between signal lines 12' and 22 (at vias 20 and 26). Further, the amount or impact of crosstalk between signal lines 12 and 22' (at vias 16 and 30) is equal or substantially equal to the crosstalk between signal lines 12' and 22' (at vias 18 and 28). Notably, substantially equal may be characterized as a substantial amount of crosstalk being canceled or reduced such that any difference in coupling between signal lines 12/12' and 22/22' is negligible (or not detrimental) to the operation of the communications system.

This notwithstanding, in those situations where the amount or impact of crosstalk between signal lines 12/12' and 22/22' (i.e., adjacent differential signal line pairs) is not equal or not substantially equal, the technique and layout of the present invention may still reduce and/or minimize crosstalk between the adjacent differential signal pairs. As such, it is intended that such situations fall within the scope of the present invention.

With reference to FIG. 6A, in one aspect, the present invention may be implemented in a high-speed digital communication system 34 including transmitter 36 and receiver 38. Briefly, transmitter 36 is connected to receiver 38 via communications channel 40, for example, a backplane. In one embodiment, transmitter 36 encodes and transforms a digital representation of the data into electrical signals. The transmitter 36 also transmits the signals to receiver 38. The received signals, which may be distorted with respect to the signals transmitted into or onto communications channel 40 by transmitter 36, are processed and decoded by receiver 38 to reconstruct a digital representation of the transmitted information. In one embodiment, receiver 38 may include differential amplifier 32. The communications channel 40 includes differential signal pairs 10a and 10b, among others.

With reference to FIG. 6B, communication system 34 typically includes a plurality of transmitters and receivers. In this regard, communications system 34 includes a plurality of unidirectional transmitter and receiver pairs (transmitter 36a and receiver 38b coupled by channel 40a; and transmitter 36b and receiver 38a coupled by channel 40b). Transmitter 36a and receiver 38a may be incorporated into transceiver 42*a* (in the form of an integrated circuit). Similarly, transmitter 36*b* and receiver 38*b* are incorporated into transceiver 42*b*. From a system level perspective, there are a plurality of such transmitter/receiver pairs in simultaneous operation, for example, four, five, eight or ten transmitter/receiver pairs, communicating across communications channel 40 having a plurality of differential signal pairs (including, for example, differential signal pairs 10*a* and 10*b*). Thus, in operation, the transmitter and receiver pairs simultaneously transmit data, control and/or clock signals across communications channel 40.

In one embodiment, transmitters 36 and receivers 38 employ a binary communications technique (i.e., pulse amplitude modulated (PAM-2) communications technique). Accordingly, each transmitter/receiver pair may operate in the same manner to send one bit of data for each symbol transmitted through communications channel 40. The present invention may utilize other modulation formats that encode more bits per symbol. Moreover, other communications mechanisms that use encoding techniques including, for example, four levels, or use other modulation mechanisms may also be used, for example, PAM-5, PAM-8, PAM-16, CAP, and wavelet modulation. In this regard, the inventions described herein are applicable to any and all modulation schemes employing differential signaling techniques.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

For example, while the present invention has been described in detail in a backplane or circuit board environment, including vias 14, 16, 18, 20, 24, 26, 28 and 30, the present invention may be employed in any wired type environments having differential signaling including microstrip, stripline, connectors and/or packages (for example, IC packages having pins or balls).

Figure 7:
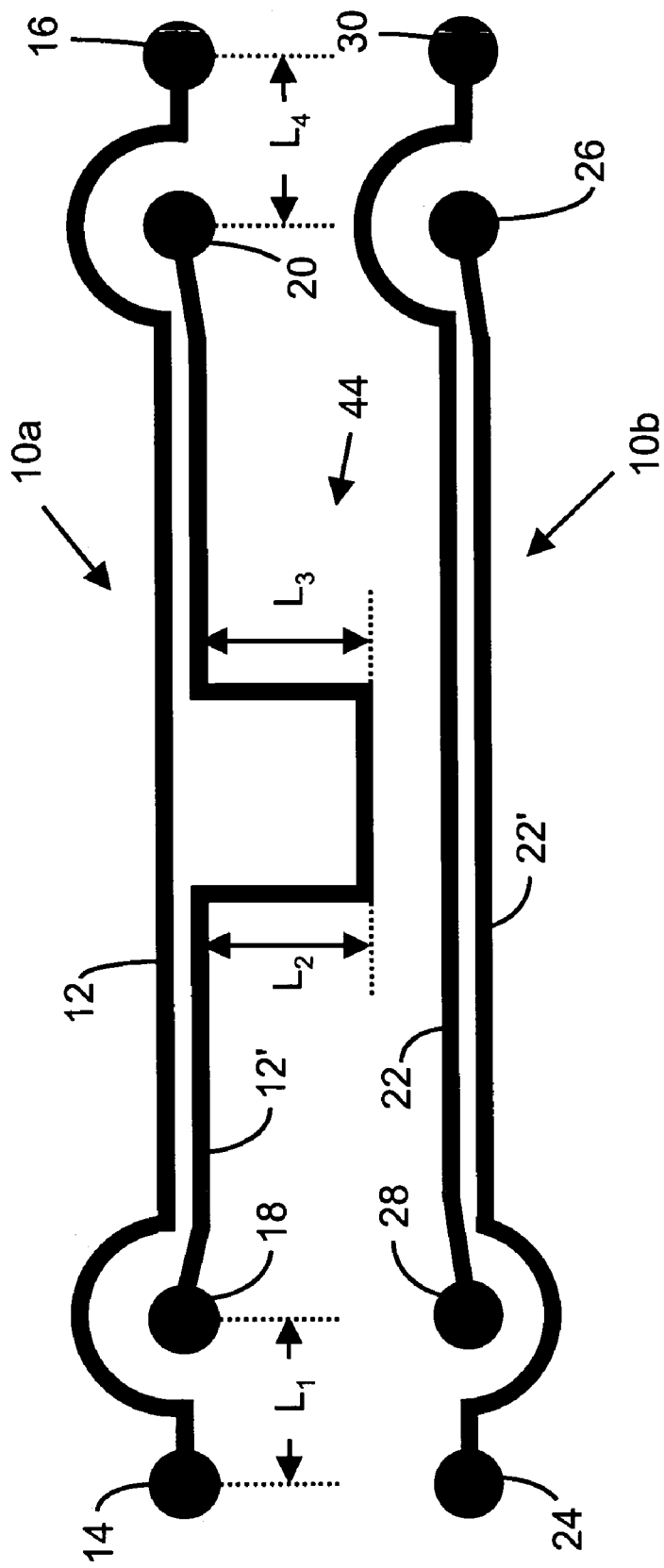
FIG. 7 is a plan view of a layout of differential signal pairs, including a skew adjustment or phase delay adjustment path, according to one embodiment of the present invention.

Further while the illustrative and exemplary embodiments of the present invention employed a routing topology having the shortest line length, it may be advantageous to include a skew adjustment path in order to reduce, adjust, minimize and/or eliminate skew between differential signal pair 10*a*. For example, with reference to FIG. 7, in one embodiment, skew adjustment path 44 may be incorporated into signal line 12' to more closely conform the length of signal lines 12 and 12'. In this way, any skew introduced by a difference in the line lengths of signal lines 12 and 12' may be reduced, minimized and/or eliminated.

Briefly, the lengths of L1, L2, L3 and L4 may be selected or chosen to compensate for the skew between the signals on lines 12 and 12' in the context of the constraints of, for example, the topology of the backplane, printed circuit board or IC package. In one embodiment, L1≅L2≅L3≅L4. In another embodiment, L1≅L2 and L3≅L4.

Figure 8A:
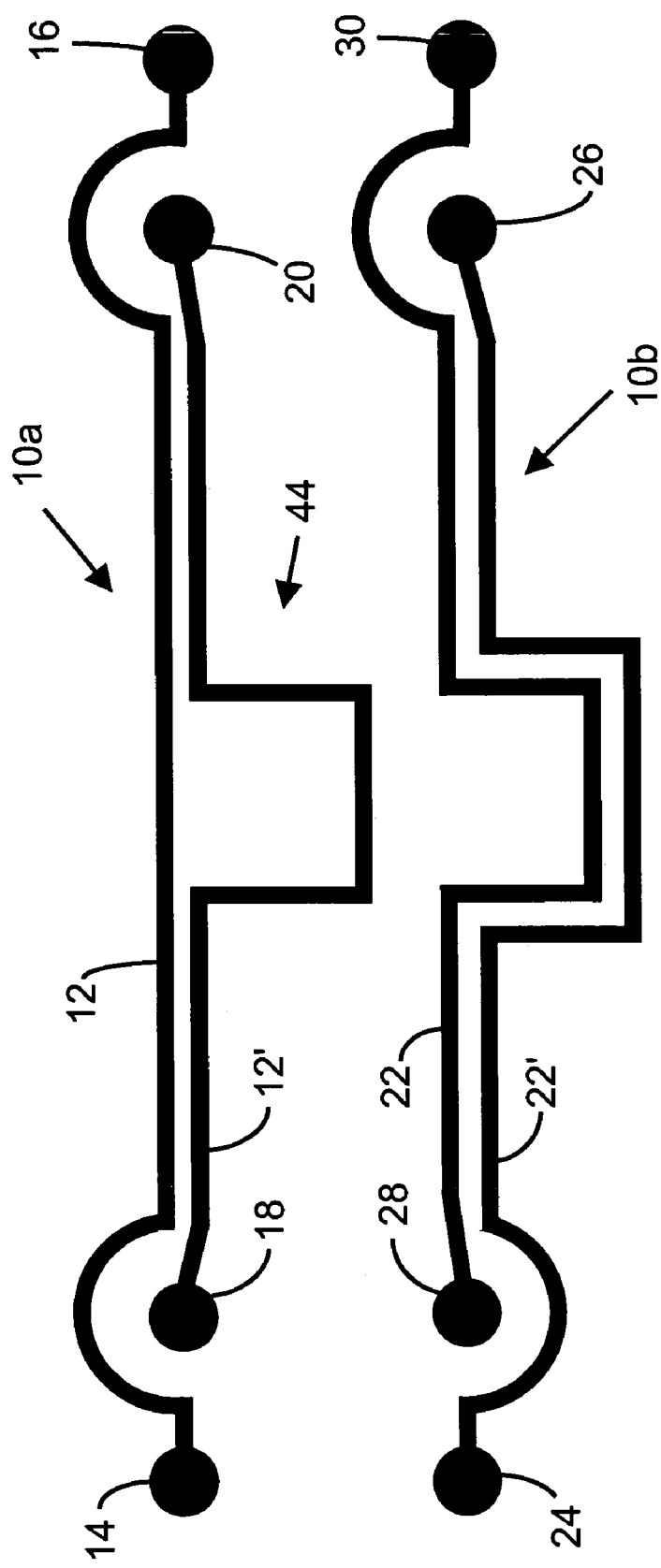
FIGS. 8A and 8B are plan views of certain layouts of differential signal pairs, including a skew adjustment or phase delay adjustment path, according to other embodiments of the present invention.
Figure 8B:
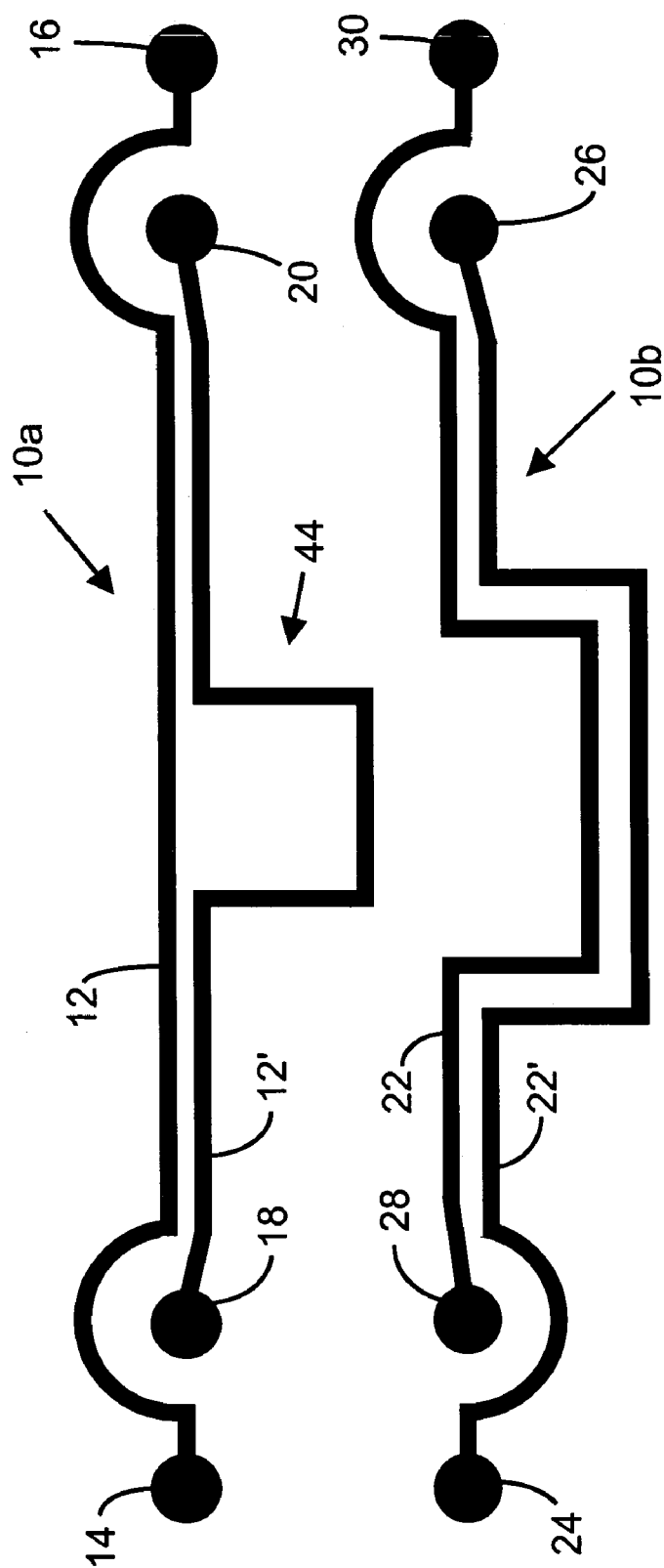

Indeed, with reference to FIGS. 8A and 8B, signal lines 22 and 22' may be routed in a manner that "mirrors" or corresponds to the topology of skew adjustment path 44. In this way, any skew between the signals on signal lines 12/12' and signal lines 22/22' may be reduced, minimized and/or eliminated.

Notably, there are many techniques to compensate for the relative phase delay between the signals on signal lines 12 and 12'. All techniques for reducing, minimizing and/or eliminating skew between the signals on lines 12 and 12', whether now known or later developed, are intended to be within the scope of the present invention.

The present invention is also applicable to printed circuit boards or multilayer packages wherein signals are routed on one or more of the same or different levels of the board or package. In this regard, signal lines 12 and 12' and 22 and 22' may be routed on the same or different levels of, for example, a multilevel printed circuit board or IC package. Indeed, signals lines 12 and 12' (and/or signal lines 22 and 22') may also be routed on different levels or planes of the board or package (which may be known as broadside coupled differential signal routing). In each embodiment, the layout and routing of signal lines 12/12' and 22/22' employ one or more of the inventive aspects of the embodiment illustrated in FIG. 3. For the sake of brevity, the discussions will not be repeated with respect to the various routing techniques of the differential signal lines 12/12' and/or 22/22'.

Notably, other techniques of reducing, minimizing and/or eliminating crosstalk may be implemented in conjunction with the inventions described herein. For example, additional insulation materials may be employed to "shield" the signals on one or more levels of a printed circuit board or backplane.

What is claimed is:

1. A backplane for a communications system, that includes a plurality of differential signal line pairs, comprising:
   a first differential signal line pair of the plurality of differential signal line pairs having a first differential signal line and a second differential signal line, wherein each differential signal line, of the first differential signal line pair, includes a first end and a second end;
   a second differential signal line pair of the plurality of differential signal line pairs having a third differential signal line and a fourth differential signal line, wherein each differential signal line, of the second differential signal line pair, includes a first end and a second end;
   a plurality of vias, including first, second, third, fourth, fifth and sixth vias, wherein each via couples to a corresponding connector terminal;
   the first differential signal line providing a communications path for a first forward signal, wherein the first end of the first differential signal line is coupled to the first via and the second end of the first differential signal line is coupled to the second via;
   the second differential signal line providing a communications path for a first reverse signal, wherein the first end of the second differential signal line is coupled to the third via and the second end of the second differential signal line is coupled to the fourth via;
   the third differential signal line providing a communications path for a second forward signal, wherein the first end of the third differential signal line is coupled to the fifth via and the second end of the third differential signal line is coupled to the sixth via; and,
   wherein the first via is spatially located adjacent to the fifth via to cause the second forward signal to have a first amount of coupling to the first forward signal and wherein the fourth via is spatially located adjacent to the sixth via to cause the second forward signal to have a second amount of coupling to the first reverse signal and wherein, without adding coupling specifically for the purpose of reducing crosstalk, the first and second amounts of coupling cause the coupling between the second forward signal and the first forward signal to be substantially equal to the coupling between the second forward signal and first reverse signal.

2. The backplane of claim 1 further including a plurality of conductor planes wherein the second forward signal is on a conductor plane of the plurality of conductor planes and the first forward and first reverse signals are on another conductor plane of the plurality of conductor planes.

3. The backplane of claim 1 further including a plurality of conductor planes wherein the second forward signal is on a conductor plane of the plurality of conductor planes and the first forward and first reverse signals are on the same conductor plane of the plurality of conductor planes as the second forward signal.

4. The backplane of claim 1 wherein the second differential signal line includes a skew adjustment path located between the first end and the second end.

5. The backplane of claim 4 wherein the lengths of the first and second differential signal lines of the first differential signal line pair are substantially equal.

6. The backplane of claim 1 wherein the second via is spatially separated from the fifth and sixth vias such that there is substantially no coupling between the first forward and second forward signals based on the spatial relationship of the second, fifth and sixth vias.

7. The backplane of claim 1 wherein the third via is spatially separated from the fifth and sixth vias such that there is substantially no coupling between the first reverse and second forward signals based on the spatial relationship of the third, fifth and sixth vias.

8. A backplane for a communications system, that includes a plurality of differential signal line pairs, comprising:
   a first differential signal line pair of the plurality of differential signal line pairs having a first differential signal line and a second differential signal line, wherein each differential signal line, of the first differential signal line pair, includes a first end and a second end;
   a second differential signal line pair of the plurality of differential signal line pairs having a third differential signal line and a fourth differential signal line, wherein each differential signal line, of the second differential signal line pair, includes a first end and a second end;
   a plurality of vias, including first, second, third, fourth, fifth, sixth, seventh and eighth vias, wherein each via couples to a corresponding connector terminal;
   the first differential signal line providing a communications path for a first forward signal, wherein the first end of the first differential signal line is coupled to the first via and the second end of the first differential signal line is coupled to the second via;
   the second differential signal line providing a communications path for a first reverse signal, wherein the first end of the second differential signal line is coupled to the third via and the second end of the second differential signal line is coupled to the fourth via;
   the third differential signal line providing a communications path for a second forward signal, wherein the first end of the third differential signal line is coupled to the fifth via and the second end of the third differential signal line is coupled to the sixth via;
   the fourth differential signal line providing a communications path for a second reverse signal, wherein the first end of the fourth differential signal line is coupled to the seventh via and the second end of the fourth differential signal line is coupled to the eighth via;
   wherein:
   the first via is spatially located adjacent to the fifth via to cause the second forward signal to have a first amount of coupling to the first forward signal;
   the second via is spatially located adjacent to the eighth via to cause the second reverse signal to have a second amount of coupling to the first forward signal;
   the third via is spatially located adjacent to the seventh via to cause the second reverse signal to have a third amount of coupling to the first reverse signal;
   the fourth via is spatially located adjacent to the sixth via to cause the second forward signal to have a fourth amount of coupling to the first reverse signal; and
   wherein, without adding coupling specifically for the purpose of reducing crosstalk, a first amount of crosstalk induced onto the first forward signal from the first amount of coupling and the second amount of coupling, is substantially equal to a second amount of crosstalk induced onto the first reverse signal from the third amount of coupling and the fourth amount of coupling.

9. The backplane of claim 8 further including a plurality of conductor planes, wherein each differential signal line pair includes a signal line carrying a forward differential signal and a signal line carrying a reverse differential signal, wherein the signal line carrying the forward differential signal is located on one of the plurality of conductor planes, and wherein the signal line carrying the reverse differential signal line is located on another one of the plurality of conductor planes.

10. The backplane of claim 8 further including a plurality of conductor planes, wherein each differential signal line pair includes a signal line carrying a forward differential signal and a signal line carrying a reverse differential signal, both of which signal lines are located on the same one of the plurality of conductor planes.

11. The backplane of claim 8 wherein the second differential signal line of the first differential signal pair includes a skew adjustment path located between the first end and the second end.

12. The backplane of claim 11 wherein the lengths of the first and second differential signal lines of the first differential signal pair are substantially equal.

13. The backplane of claim 11 wherein the third and fourth differential signal lines of the second differential signal pair include a layout having a topology that corresponds to the topology of the skew adjustment path.

14. The backplane of claim 13 wherein lengths of each differential signal lines of the first and second differential signal pairs are substantially equal.

15. The backplane of claim 11 wherein lengths of each differential signal lines of the first and second differential signal pairs are substantially equal.

* * * * *